United States Patent [19]

Williams et al.

[11] 4,079,326
[45] Mar. 14, 1978

[54] ALTERNATING VOLTAGE LEVEL DETECTING APPARATUS

[75] Inventors: Anthony Williams, Newport; Adrian Orton Newbould, Stafford, both of England

[73] Assignee: The General Electric Company Limited, London, England

[21] Appl. No.: 747,405

[22] Filed: Dec. 3, 1976

[30] Foreign Application Priority Data

Dec. 8, 1975 United Kingdom ............... 50190/75

[51] Int. Cl.[2] .................... H03K 1/18; H03K 5/153
[52] U.S. Cl. .................... 328/150; 307/265; 328/58
[58] Field of Search ............... 328/150, 138, 58; 307/360, 265

[56] References Cited

U.S. PATENT DOCUMENTS

| | | | |
|---|---|---|---|
| 3,693,028 | 9/1972 | Fussell | 328/150 X |
| 3,706,851 | 12/1972 | Froehlich et al. | 328/150 X |
| 3,781,652 | 12/1973 | Weaver | 328/150 X |
| 3,963,944 | 6/1976 | Kristiansen | 328/150 X |

*Primary Examiner*—John S. Heyman
*Attorney, Agent, or Firm*—Kirschstein, Kirschstein, Ottinger, Frank & Cobrin

[57] ABSTRACT

A voltage level detector which detects when a periodic waveform voltage exceeds a predetermined value for a predetermined time and upon detection produces an output, this output being cancelled, after a predetermined delay, if detection ceases. The drop off/pick up ratio of the detector may be reduced by providing feedback from the output.

7 Claims, 3 Drawing Figures

ALTERNATING VOLTAGE LEVEL DETECTING APPARATUS

This invention relates to periodic waveform voltage level detecting apparatus and more especially, but not exclusively, to such apparatus for use in power supply system protection devices.

A known form of periodic waveform voltage level detector involves the integration of pulses having a duration equal to the period during the half-cycle that the instantaneous input voltage exceeds a reference value and subsequent detection of when the integrated signal exceeds a threshold value. These known detectors suffer the disadvantage of long operate times for inputs just exceeding the reference value and furthermore they respond to a d.c. input.

It is an object of the present invention to provide a voltage level detector wherein these disadvantages may be avoided.

According to the present invention a periodic waveform voltage level detecting apparatus comprises: a level detector for producing pulses of duration representative of the periods during which the instantaneous value of a periodic waveform voltage at its input exceeds a reference value; and timing means for producing an output pulse in response to each output pulse of the level detector that has a duration of predetermined relationship to a predetermined value.

Preferably said timing means comprises a first timer for producing in response to each output pulse of the level detector a pulse of duration equal to said predetermined value or the same duration as the output pulse of the level detector, whichever is the shorter, and means for producing an output pulse in response to each output pulse of the level detector of greater duration than the corresponding output pulse of said timer.

Such an arrangement suitably further includes output means comprising a second timer for producing an output pulse of predetermined duration in response to each output pulse of said timing means, and means for producing an output signal in response to each output pulse of said second timer and for terminating said output signal in response to the absence of an output pulse from both said first and second timers, the sum of the durations of the pulses of predetermined duration produced by the first and second timers being greater than the half cycle period of the input signal.

One particular application of an apparatus in accordance with the invention is for detecting the level of an alternating voltage. In such an application the level detector is suitably arranged to produce pulses of duration representative of the periods during which the instantaneous value of said periodic waveform voltage exceeds either of two reference values of equal magnitude and opposite polarity.

It will be appreciated that the apparatus may also be used as a periodic waveform current level detector by using an input for the apparatus a periodic waveform voltage proportional to the current.

The invention will be more readily understood from the following description of a preferred embodiment thereof, an alternating voltage level detector, taken in conjunction with the accompanying drawings, in which.

Figure 1:
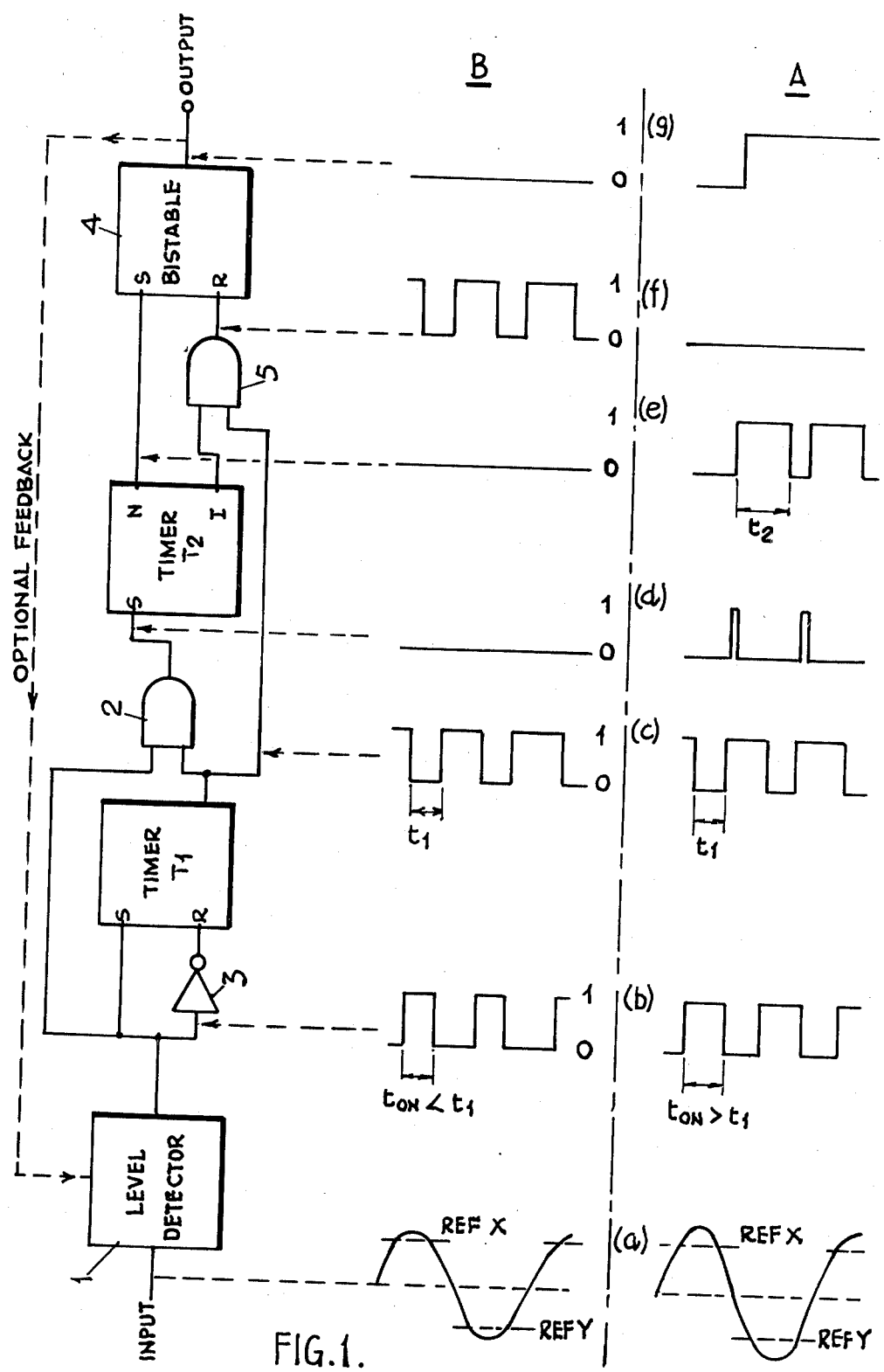
FIG. 1 shows a block schematic diagram of the preferred embodiment, and two sets of waveforms A and B appearing at various points in the embodiment when supplied with an alternating voltage input signal, the two sets A and B corresponding to when the input signal is respectively above and below the level it is requied to detect.

Referring to FIG. 1, the embodiment includes a level detector 1 to which an alternating voltage input signal of fixed, known frequency is applied. The detector produces a logic '1' output when the instantaneous voltage of the input signal exceeds either of two reference values X and Y of equal magnitude and opposite polarity (see FIG. 1(a)). Thus, as shown at (b) in FIG. 1, the detector output comprises a series of pulses, one for each half cycle of the input signal, each pulse having a duration $t_{ON}$ equal to the time during the corresponding half cycle that the instantaneous voltage of the input signal exceeds the reference voltage of relevant polarity.

The output signal of the detector is applied directly to a setting input S of a timer T1 which is essentially a monostable device and to one input of a two-input AND gate 2, and via an inverter 3 to a resetting input R of the timer. The timer is triggered by the leading edge of each pulse $t_{ON}$ applied on its setting input and is reset after a time $t_1$ or by the leading edge of the pulse applied to its resetting input, i.e. the trailing edge of the pulse $t_{ON}$, if the pulse $t_{ON}$ is of duration less than $t_1$. Thus, in response to each pulse $t_{ON}$, the timer T1 produces a logic '0' for a time $t_1$ or $t_{ON}$, whichever is the shorter (see FIG. 1(c)).

The second input of the AND gate 2 is connected to the output of timer T1. Hence whenever $t_{ON}$ exceeds $t_1$, the AND gate 2 produces at its output a logic '1' for a time $t_{ON} - t_1$, the output otherwise remaining in the logic '0' state (see FIG. 1(d)). Hence the timer T1 and the AND gate 2 comprise a timing means for producing an output pulse in response to each output pulse of the level detector that has a duration of predetermined relationship to a predetermined value.

The output of the AND gate 2 is applied to a setting input S of a second timer T2 which is also essentially a monostable device and which has two outputs N and I one being the inverse of the other. Timer T2 produces a logic '1' of duration $t_2$ at its normal output in response to a leading edge of a signal at its setting input, i.e. whenever $t_{ON}$ exceeds $t_1$ (see FIG. 1(e)). Hence the timer T2 produces an output pulse of predetermined duration in response to each output pulse of the timing means comprising timer T1 and AND gate 2.

The signal from the normal output N of timer T2 is applied directly to a setting input S of a bistable device 4 which gives a constant direct output voltage, constituting the output of the apparatus as a whole, in response to he leading edge of a pulse applied to that input. The inverted output signal from timer T2 is applied to one input of a two-input AND gate 5 whose other input is provided by the output of timer T1, the output of the gate 5 being applied to the resetting input R of the bistable device 4.

The bistable device 4 will thus give a direct output voltage when there is a logic '1' from the normal output of timer T2, and which occurs when $t_{ON}$ exceeds $t_1$ (see FIG. 1(g)). The bistable device is reset by the leading edge of a pulse from the AND gate 5 and such a pulse occurs in the absence of an output pulse from both timer T1 and timer T2, i.e. when the inverted output from timer T2 and the output from timer T1 give a logic '1' at the same time (see FIG. 1(f)). Hence the bistable device 4 and the AND gate 5 together comprise means for producing an output signal in response to each output pulse of the second timer and for terminating said output signal in response to the absence of an output pulse from both the first and second timers.

The sum of the periods $t_1$ and $t_2$ is made greater than the half period tp of the input waveform to the level detector so that a pulse from the AND gate 5 will occur, and thus bistable 4 will reset, only when $t_{ON}$ is less than $t_1$, but not when $t_{ON}$ exceeds $t_1$.

Thus the apparatus produces a steady direct output voltage whenever the peak value Vp of the input voltage exceeds a value $V_{DET}$ for which the instantaneous value of the input voltage exceeds the reference voltage of the detector for just longer than the duration $t_1$ of the pulses produced by the timer T1. Thus the minimum peak value $V_{DET}$ at which the apparatus produces an output, i.e. the operate level, may be varied by variation of the reference voltage or the duration $t_1$ of the pulses provided by timer T1.

Figure 2:
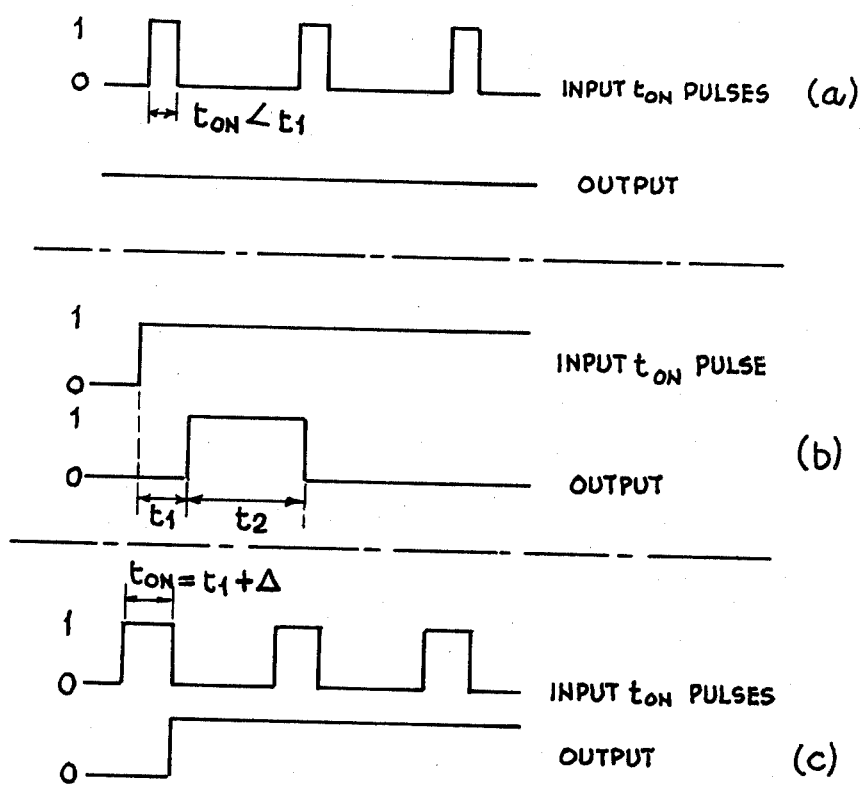
FIG. 2 shows the output waveforms produced by the embodiment in response to various different input signals.

FIG. 2 shows the output produced by the apparatus shown in FIG. 1 for different $t_{ON}$ pulses from the level detector. FIG. 2(a) shows the output when $t_{ON}$ is less than $t_1$ and no output results. FIGS. 2(b) and 2(c) show important operating features of the apparatus. FIG. 2(b) shows the response to a direct voltage input of value greater than the reference value, and demonstrates the initial response of the apparatus which resets quickly after a period equal to $t_1 + t_2$. FIG. 2(c) shows the output produced in response to an input waveform in which Vp just slightly exceeds $V_{DET}$ and as shown an output is produced in the first half cycle at which the overvoltage occurs.

Figure 3:
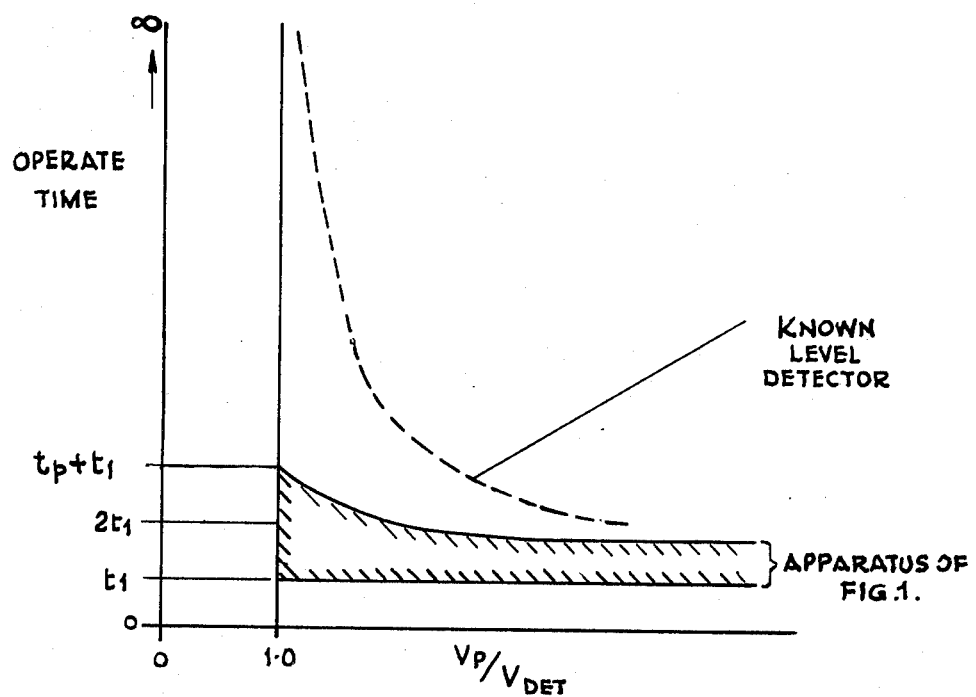
FIG. 3 shows a graph comparing the operate time of the apparatus of FIG. 1 compared with a known type of level detector.

FIG. 3 illustrates graphically the variation of the operate time of the apparatus of FIG. 1 with the ratio Vp/$V_{DET}$ compared with a known integrating type of alternting voltage level detector. Thus when Vp just exceeds $V_{DET}$, the operate time has a maximum value of $tp + t_1$ and a minimum value of $t_1$ and when Vp is much larger than $V_{DET}$, the operate time has a maximum value of $2t_1$ and a minimum value of $t_1$. The reset time of the apparatus of FIG. 1 lies between zero and $t_2$.

It will be understood that the reset level of the apparatus shown in FIG. 1 is the same as the operate level, i.e. the apparatus has a drop off/pick up ratio of unity. If required the drop off/pick up ratio may be reduced by providing feedback from the output to either the timer T1 or the level detector 1 to either reduce the reference voltage or the duration of $t_1$ of the pulses produced by the output for reset, thereby lowering the reset level with respect to the operate level.

The time $t_1$ is suitably chosen to be three tenths of the half cycle period of the input signal i.e. 3 milliseconds for a 50 Hz input, and the time $t_2$ is suitably chosen to be eight-tenths of the half-cycle period, i.e. 8 milliseconds for a 50 Hz input.

We claim:

1. A periodic waveform voltage level detecting apparatus comprising:
   I. a level detector for producing pulses of duration representative of the periods during which the instantaneous value of a periodic waveform voltage at its input exceeds a reference value; and
   II. timing means for producing an output pulse in response to each output pulse of the level detector that has a duration of predetermined relationship to a predetermined value, said timing means comprising
      A. a first timer for producing in response to each output pulse of the level detector a pulse of duration equal to said predetermined value or the same duration as the output pulse of the level detector, whichever is the shorter, and
      B. means,
         i. arranged to receive each output pulse of thee level detector and each output pulse of the first timer,
         for producing an output pulse in response to each output pulse of the level detector of greater duration than the corresponding output pulse of said timer.

2. A periodic waveform voltage level detecting apparatus as claimed in claim 1 further including output means comprising a second timer for producing an output pulse of predetermined duration in response to each output pulse of said timing means, and means for producing an output signal in response to each output pulse of said second timer and for terminating said output signal in response to the absence of an output pulse from both said first and second timers, the sum of the durations of the pulses of predetermined duration produced by the first and second timers being greater than the half-cycle period of the input signal.

3. A periodic waveform voltage level detecting apparatus as claimed in claim 2 wherein said means for producing said output signal comprises a bistable device.

4. A periodic waveform voltage level detecting apparatus as claimed in claim 3 wherein said means for terminating said output signal comprises an AND function gate, one of whose inputs is connected to an output of the first timer and another of whose inputs is connected to an output of the second timer and whose output is connected to a resetting input of the bistable device.

5. A periodic waveform voltage level detecting apparatus as claimed in claim 1 where said timing means is triggered by the leading edge of the output pulses of the level detector.

6. A periodic waveform voltage level detecting apparatus as claimed in claim 1 wherein feedback is provided from the output of the output means to either said timing means or said level detector so as to reduce the drop off/pick up ratio of the apparatus.

7. An apparatus according to claim 1 for detecting the level of an alternating voltage wherein the level detector produces pulses of duration representative of the periods during which the instantaneous value of said periodic waveform voltage exceeds either of two reference values of equal magnitude and opposite polarity.

* * * * *